United States Patent [19]
Davis et al.

[11] Patent Number: 5,392,292
[45] Date of Patent: Feb. 21, 1995

[54] CONFIGURABLE SPARE MEMORY CHIPS

[75] Inventors: Thomas J. Davis; Michael T. Bye; Richard D. Pribnow; Bricky A. Stephenson, all of Chippewa Falls, Wis.

[73] Assignee: Cray Research, Inc., Eagan, Minn.

[21] Appl. No.: 149,967

[22] Filed: Nov. 10, 1993

Related U.S. Application Data

[63] Continuation-in-part of Ser. No. 721,931, Jun. 27, 1991, abandoned.

[51] Int. Cl.⁶ .............................................. G06F 11/20
[52] U.S. Cl. ........................... 371/11.1; 364/245.3; 364/970.1; 364/DIG. 1; 364/DIG. 2
[58] Field of Search ............... 371/10.1, 10.2, 10.3, 371/11.1; 364/245.3, 970.1; 395/575; 365/200

[56] References Cited

U.S. PATENT DOCUMENTS

| | | | |
|---|---|---|---|
| 3,803,560 | 4/1974 | DeVoy et al. | 371/2.2 |
| 3,995,261 | 11/1976 | Goldberg | 371/10.3 |
| 3,999,051 | 12/1976 | Petschauer | 371/10.2 |
| 4,345,319 | 8/1982 | Bernardini et al. | 365/210 |
| 4,475,194 | 10/1984 | LaVallee et al. | 371/10.2 |
| 4,507,730 | 3/1985 | Johnson et al. | 371/9.1 |
| 4,566,102 | 1/1986 | Hefner | 371/11.1 |
| 4,584,682 | 4/1986 | Shah et al. | 371/2.2 |
| 4,646,304 | 2/1987 | Fossatti et al. | 371/38.1 |
| 4,691,301 | 9/1987 | Anderson | 371/10.3 |
| 4,710,934 | 12/1987 | Traynor | 371/38.1 |
| 5,134,584 | 7/1992 | Boler et al. | 365/200 |
| 5,163,023 | 11/1992 | Ferris et al. | 365/200 |

OTHER PUBLICATIONS

Sedra and Smith, Microelectronic Circuits, 771–773 (1982).

*Primary Examiner*—Charles E. Atkinson
*Attorney, Agent, or Firm*—Schwegman, Lundberg & Woessner

[57] ABSTRACT

A memory reconfiguration system dynamically configures spare chips into memory during system operation by shifting data around defective chips. The shifting of data around an entire memory chip allows the system to correct bit, addressing, and control errors or faults within the chip. When the system detects an error, or otherwise initiates a memory reconfiguration, it transmits a configuration code to shift registers for a memory write driver. The shift registers, in response to the configuration code, shift write data so that the data is effectively shifted around a particular memory chip and into a spare memory chip. The system selectively transmits the configuration code to shift registers for a memory read driver. Therefore, the system independently shifts data written to the memory inputs and data read from the memory outputs.

5 Claims, 8 Drawing Sheets

CONFIGURABLE SPARE MEMORY CHIPS

This is a continuation-in-part of patent application Ser. No. 07/721,931, filed Jun. 27, 1991, now abandoned, which is incorporated herein by reference.

FIELD OF THE INVENTION

The present invention relates to a system for reconfiguring a computer memory.

BACKGROUND OF THE INVENTION

Computer system downtime for maintenance reasons is very undesirable. This is especially true in large-scale computer systems such as the type designed by Cray Research, Inc., the assignee of the present application. Downtime has detrimental effects in all applications of computers. For example, computer system downtime may delay results of lengthy and complex calculations, and this delay could affect product development which relies upon those calculations. In a competitive marketplace, a delay in product delivery could be devastating for a company. If a computer is used for leasing time, downtime could reduce the amount of time leased and hence decrease the corresponding amount of revenue. Other applications of computers likewise suffer during the delay of downtime.

The detrimental effects of computer system downtime may be minimized by increasing the reliability and mean time between failures of the system. One critical factor creating system downtime is memory failure. Following fabrication of memory circuits, some cells may be defective. During system performance, cells may become defective due to operating or environmental conditions. Minimizing these memory failures will help to reduce or prevent system downtime.

A method of compensating for defective cells which result during fabrication is to include dummy cells within the memory array. When the defective cells are discovered during testing of the memory array following fabrication, the dummy cells may be electronically substituted for the defective cells. This process, however, may only be used before the computer system is fully assembled and is not effective during system operation. This process is also permanent and may not be reversed.

Some computer systems use error correction codes to detect and correct memory errors in hardware. The error correction codes may become complex, however, and there is a practical limit to the number of bits which may be corrected by this method. This limit may be determined by the number of additional bits required to implement error correction codes. Furthermore, these additional bits require changes in the capacity of the memory banks, busses, and related circuitry, all of which will severely affect an original memory design.

Some systems use shifting techniques in order to reconfigure memory. These systems shift data around a defective or bad chip on the inputs and outputs to memory. A spare chip effectively replaces the defective or bad chip. When these systems initiate reconfiguration of memory, identical shifting occurs on both the inputs and outputs. Therefore, previously stored data cannot be read from memory in its state as originally stored, because any read operation will occur subject to the shifting of data on the outputs.

A need thus exists for an apparatus for reconfiguring a memory during system operation in order to avoid time-consuming and undesirable system maintenance downtime. A need further exists for a memory reconfiguration apparatus which allows independent shifting on inputs and outputs to memory so that, for example, stored data may be read from memory is its state as stored while data is written to memory in a reconfigured state.

SUMMARY OF THE INVENTION

This invention provides increased fault tolerance by dynamic reconfiguration of a computer memory. A reconfiguration system configures spare memory chips into memory banks during system operation by shifting data around defective chips. The shifting of data around an entire memory chip allows the system to correct bit, addressing, and control errors or faults within the chip. When the system detects an error, or otherwise initiates a memory reconfiguration, it transmits a configuration code to shift registers for a memory write driver. The shift registers, in response to the configuration code, shift write data so that the data is effectively shifted around a particular memory chip. The system selectively transmits the configuration code to shift registers for a memory read driver. Therefore, the system can shift data on the memory inputs without shifting data read from the memory outputs.

The reconfiguration is typically transparent to a user and requires no addressing changes to memory. Furthermore, the reconfiguration is preferably reversible so that, during a routine maintenance check, the defective memory chip may be replaced. The memory bank may then be returned to its original storage configuration by clearing all shift controls with a deadstart or an appropriate code.

This dynamic reconfiguration is preferably implemented with logic which has a minimal impact on the memory system design. Since the reconfiguration occurs by shifting a data word around a defective chip, the reconfiguration system is implemented with a much lesser degree of hardware complexity and memory latency than a multiplexing scheme. This facilitates the implementation of the present invention without adversely or significantly affecting an original memory design.

DETAILED DESCRIPTION OF THE PREFERRED EMBODIMENT

In the following detailed description of the preferred embodiment, reference is made to the accompanying drawings which form a part hereof and in which is shown by way of illustration a specific embodiment in which the invention may be practiced. This embodiment is described in sufficient detail to enable those skilled in the art to practice the invention, and it is to be understood that other embodiments may be utilized and that structural or logical changes may be made without departing from the scope of the present invention. The following detailed description is, therefore, not to be taken in a limiting sense, and the scope of the present invention is defined by the appended claims.

Memory Architecture

Figure 1:
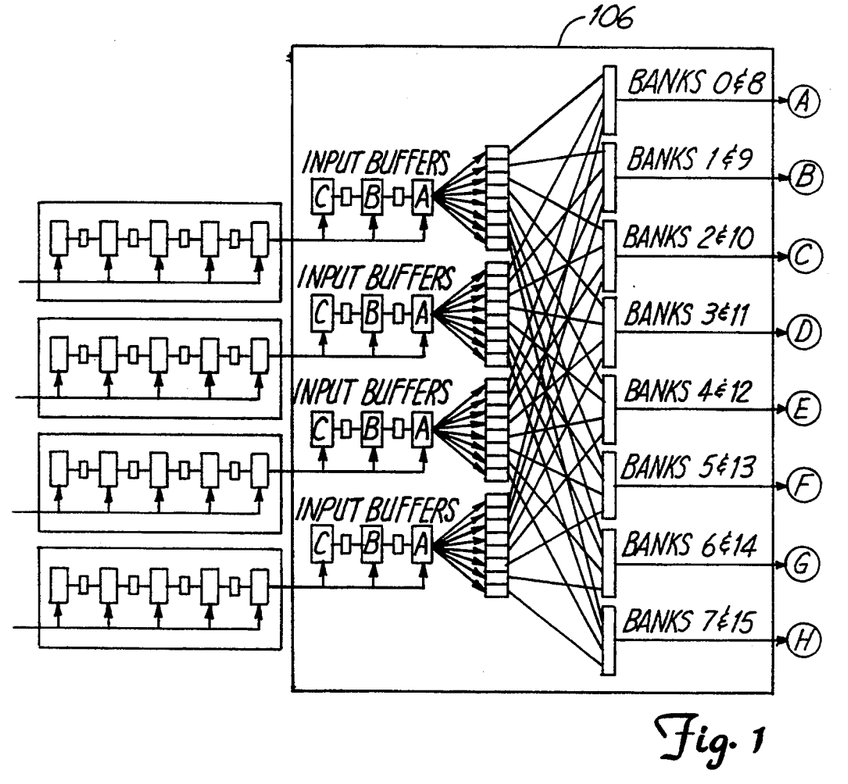
FIGS. 1-3 are a general block diagram of a memory architecture which incorporates the present invention.
Figure 2:
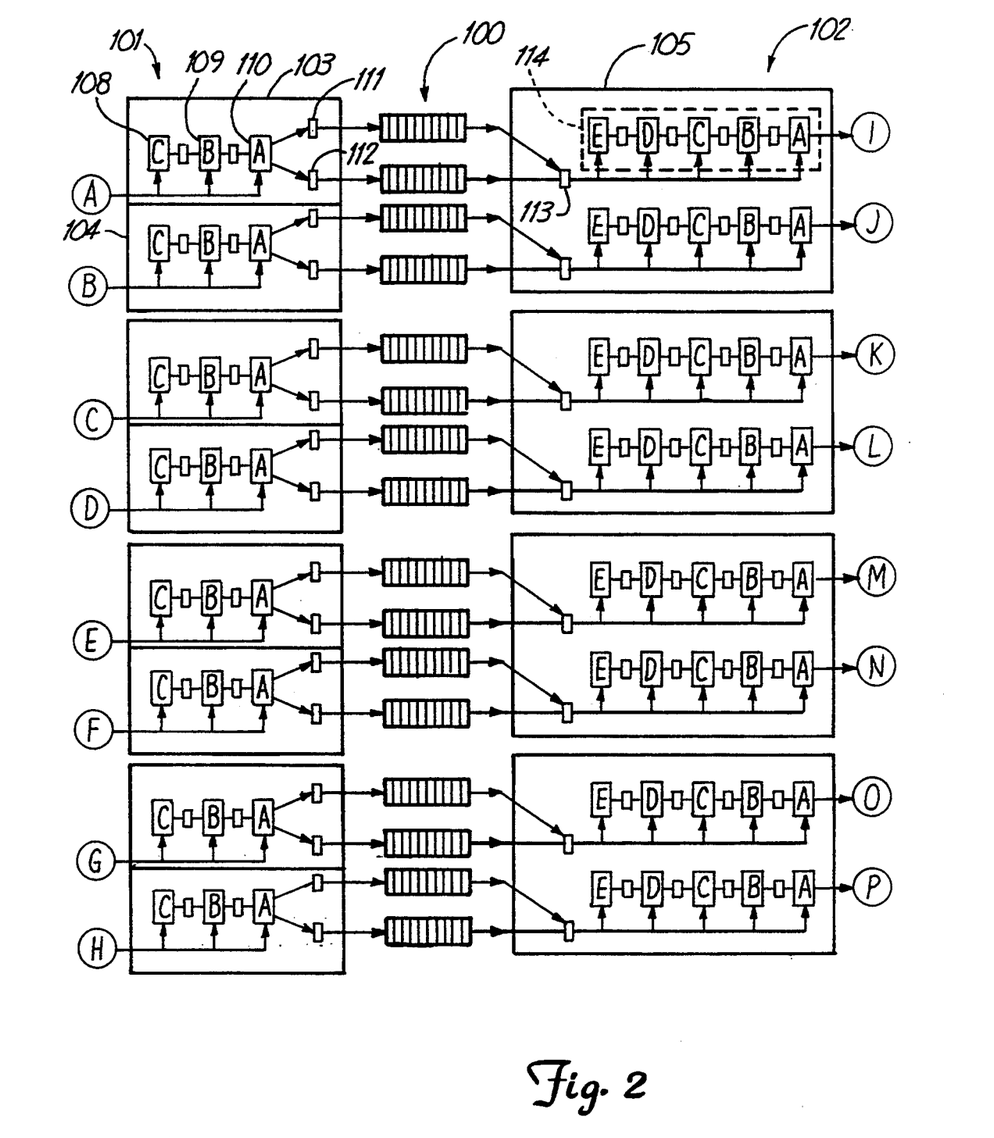
Figure 3:
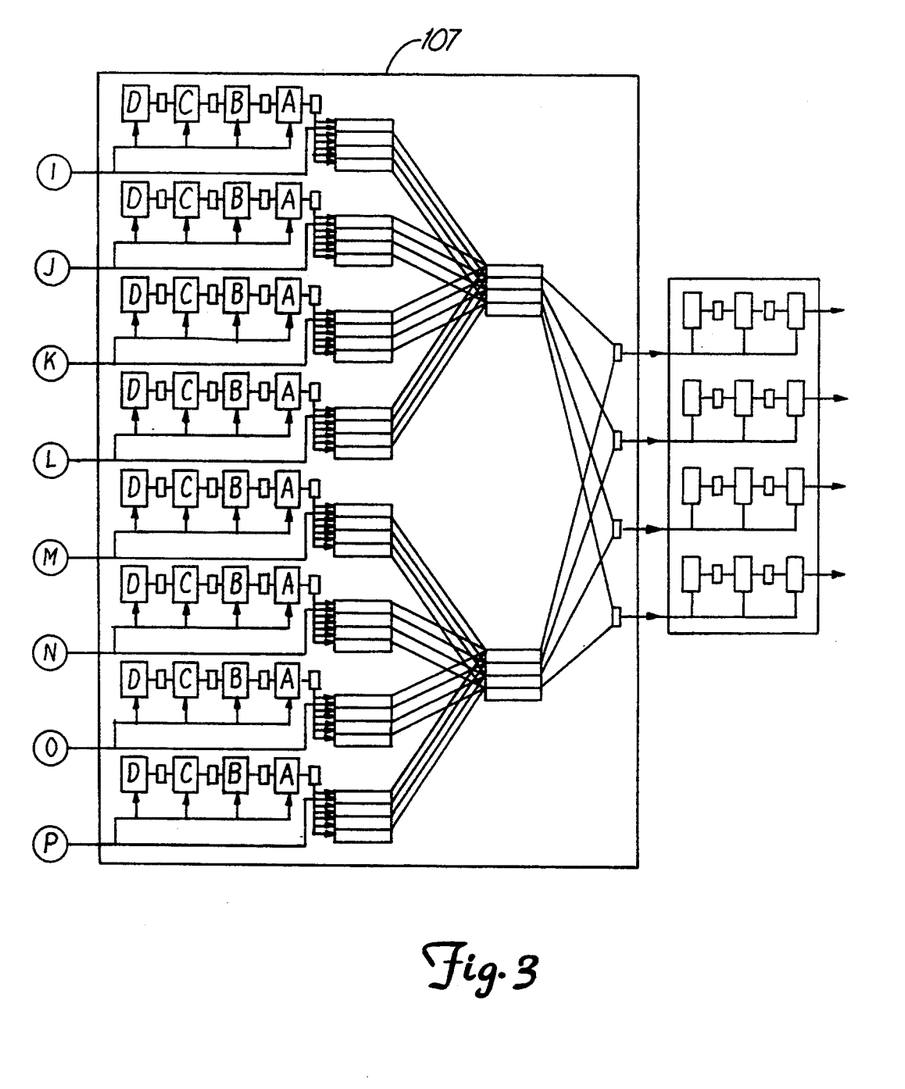

FIGS. 1–3 are a general block diagram of a memory module which may incorporate reconfiguration circuitry. The actual data storage occurs in a plurality of memory storage units 100. These are typically organized by a series of banks 0–15. Each of the banks is divided among two stacks of memory IC chips. Each stack of memory IC chips contains two half banks. Therefore, two stacks constitute two full banks in the memory storage units 100. Each bank has the capability to store one word of data.

A plurality of memory driver units 101 interfaces with the memory storage units 100 in order to transmit data to the memory banks 0–15. Each driver unit, for example driver 103, receives data words and holds those data words in buffers 108–110. These buffers transfer data words to one of two output buffers 111 or 112, depending upon the address of the bank where the data is to be stored. The output buffers 111 and 112 are connected to memory banks 0 and 8 respectively. The output buffers 111 and 112 receive a data word from buffers 108–110 and drive banks 0 or 8 in order to store the data word in one of these two banks.

The memory likewise contains a plurality of memory receiver units 102 which receive data from the memory banks 0–15 and transmit the data to a requested location. Memory receiver 105, for example, contains circuitry to receive data from four banks (banks 0, 1, 8, and 9). Receiver 105 contains an input buffer 113-which reads data from banks 0 and 8. Upon reading the data, input buffer 113 routes the data word to one of a plurality of holding buffers 114.

Finally, the memory banks, memory drivers, and memory receivers are interfaced with processors (not shown) of a computer through crossbar networks 106 and 107. Crossbar network 106 receives a memory reference from a processor. The memory reference includes the data to be stored and the address where the data is to be stored. Depending upon the address in the memory reference, crossbar network 106 routes the memory reference to the appropriate memory driver among the plurality of memory drivers 101. The memory reference is held in an output buffer in the crossbar network after the reference has been decoded. When a holding buffer is available in the appropriate memory driver, the reference is latched into a buffer in the memory driver. The memory driver will then latch the data into the appropriate memory bank. A description of the implementation of a similar memory architecture is disclosed in U.S. Pat. No. 5,167,511, filed Nov. 27, 1990, entitled HIGH DENSITY INTERCONNECT APPARATUS, assigned to the assignee of the present application and incorporated herein by reference.

Crossbar network 107 performs the reverse function. Crossbar network 107 receives data from the plurality of memory receivers 102. The data waits in holding registers in crossbar network 107 until it can be routed to an output buffer. From the output buffer, the data is transmitted to the processor which requested the data.

A more detailed description of the operation of crossbar networks is provided in U.S. patent application Ser. No. 07/600,328, filed Oct. 19, 1990, entitled SCALABLE PARALLEL SUPERCOMPUTER ARCHITECTURE, assigned to the assignee of the present application and incorporated herein by reference. The preferred embodiment shows one possible memory configuration incorporating reconfiguration circuitry. Other memory architectures are available for implementing the present invention.

Memory Reconfiguration

Figure 4:
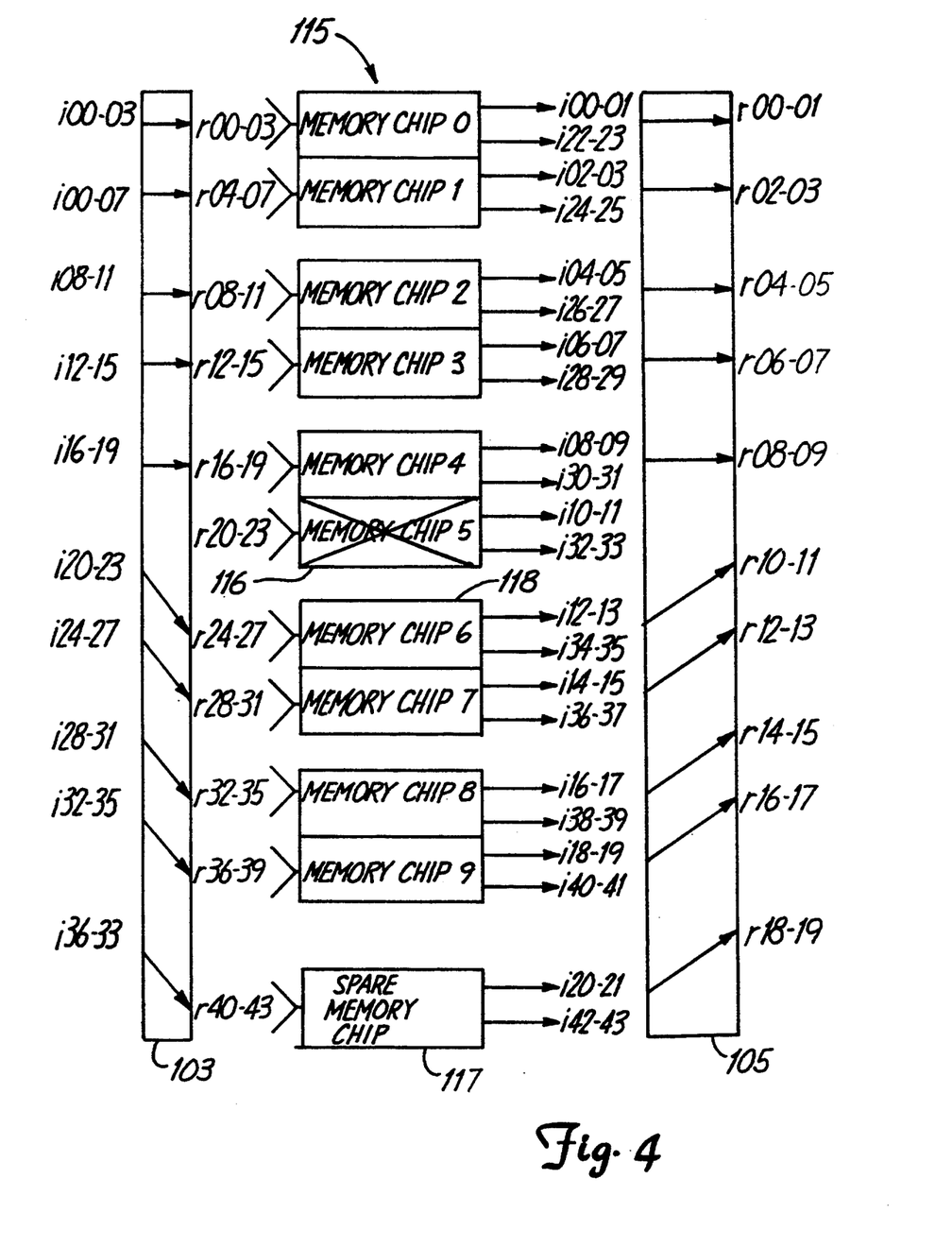
FIG. 4 is a block diagram of the conceptual method by which a memory blank is reconfigured to avoid using a defective memory location.

FIG. 4 is a block diagram which illustrates the operation of memory reconfiguration circuitry. For this example, assume that bits 20–23 contained within IC chip 116 are declared bad. In other words, a computer system interfaced to the memory module has determined that IC chip 116 is producing errors or otherwise initiates a memory reconfiguration.

When an error or fault is detected, or a reconfiguration is otherwise initiated, the system typically reconfigures memory during system operation so that time-consuming system downtime is not needed to correct a memory error. When reconfiguration of a bank occurs, the operating system is halted, the reconfiguration takes place, and then the operating system is reloaded. This process is usually necessary because data in the bank becomes invalid after the reconfiguration and must be reloaded. This entire reconfiguration process, however, occurs in matter of seconds, as compared with hours of potential maintenance downtime which would ordinarily be required to repair or replace the defective memory chip.

During the reconfiguration process, as illustrated in FIG. 4, the bits in memory array 115 are reconfigured by shifting a portion of the data word beginning with the defective chip location. The bits from bit positions 20–23, which had previously been stored in defective chip 116, are now stored in memory chip 118 (bit positions 24–27). The remaining bits 28–43 are also shifted four bit positions, and spare IC chip 117 then functions to store bits 40–43, which were shifted from the end of array 115. Thus, spare IC chip 117 is effectively configured into the bank so that, when this portion of the data word is shifted, the bank has sufficient storage capacity without using defective IC chip 116.

After the data word enters memory driver 103, the memory driver shifts a portion of the data word. For this example, the portion of the data word beginning with bits 20–23 is shifted four bit positions. Next memory driver 103 transmits the shifted data word in parallel to stack 115. Since a portion of the data word has been shifted, defective IC chip 116 is not used for storing any portion of the data word.

When the data word is retrieved from memory, it is typically shifted again so that the data word is in the same configuration as when it was transmitted to the stack. Memory receiver 105 retrieves the data word in parallel from stack 115. Memory receiver 105, in response to control signals, shifts a portion of the data word four bit positions starting with bit position 20. The data word, as a result of the shifting, is in the same configuration as when transmitted to memory and may now be transmitted to the crossbar network. Alternatively, memory receiver 105 can shift the read data independent of any shifting that occurs on the input side of a memory array.

The particular implementation shown in FIG. 4 may correct one IC memory chip for each half word of memory, since each stack contains one spare IC chip for each half bank. Since the memory avoids using an entire chip following the reconfiguration, the system may correct addressing and control errors within the chip in addition to correcting bit errors. Each memory IC chip typically stores four bits of information. If one bit on a particular IC chip is determined to be creating errors, the system will preferably declare all four bits defective on the IC chip. In this manner, when an error is detected or the system otherwise initiates memory configuration, the system preferably shifts the data word four bit positions and uses all bits on the spare IC chip. While many computer systems, such as those developed by Cray Research, Inc., the assignee of the present invention, use error correction codes in hardware, the present invention provides another level of error correction. This additional level of error correction will allow the computer system to operate for longer periods between maintenance downtime.

Memory Reconfiguration Circuitry

Figure 5:
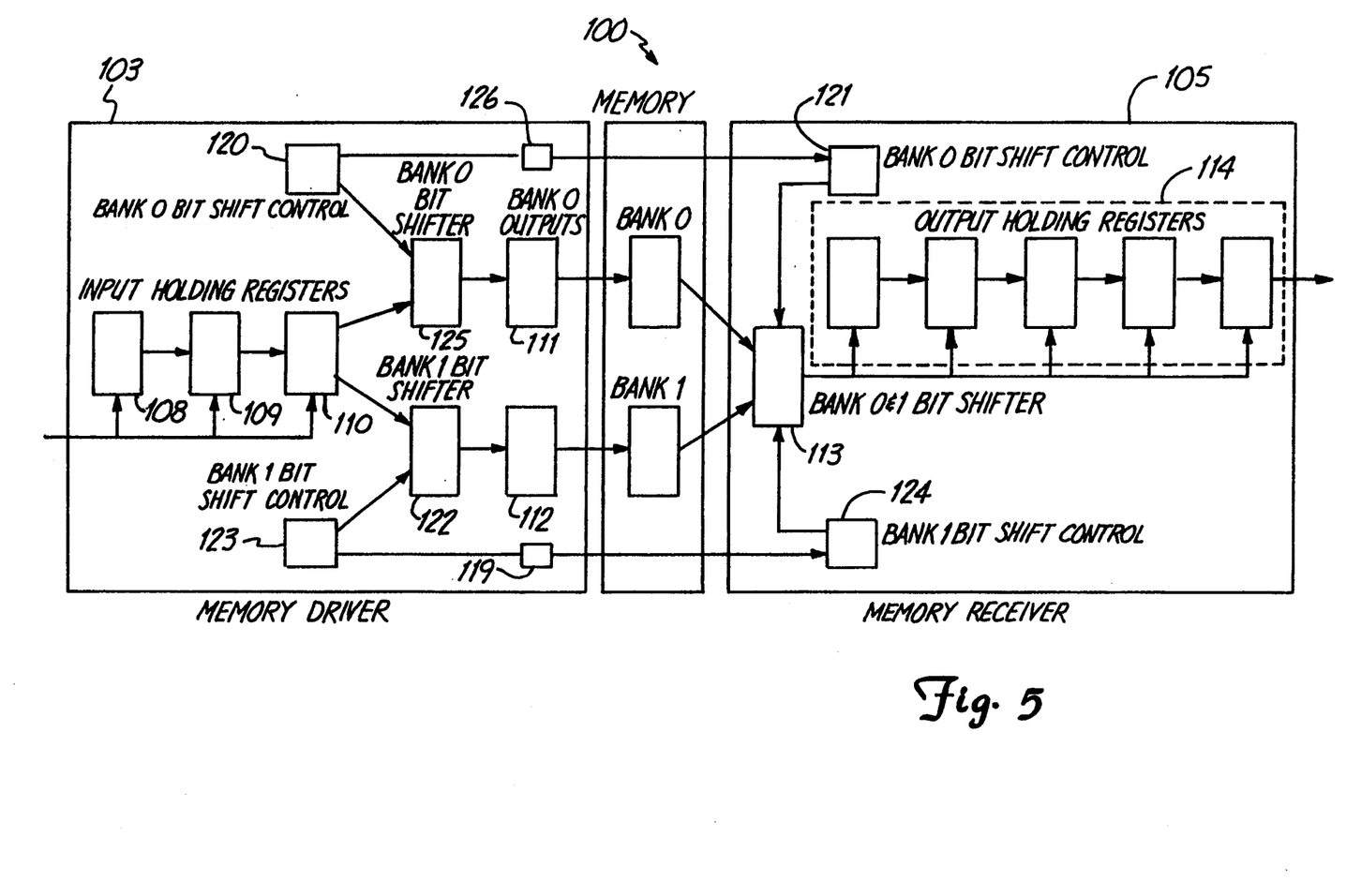
FIG. 5 is a block diagram of memory driver and receiver units which contain the circuitry for reconfiguring a memory stack.

FIG. 5 shows additional hardware in memory driver 103 and receiver 105 which performs the reconfiguration described above. In addition to the hardware explained in conjunction with FIGS. 1–3, the additional hardware typically includes bit shifters 125 and 122, bank 0 bit shift control units 120 and 121, and bank 1 bit shift control units 123 and 124. Buffer 113 also functions as a bit shifter.

Memory reconfiguration typically begins with the detection of recurring errors or faults in a same memory location. Memory reconfiguration can also begin with the detection of recurring addressing or control errors or faults in a memory chip. Normally, address and control failures would cause a maintenance break. However, since the memory avoids using an entire defective chip with this correction process, the system can configure around the address and control failures within the memory chips.

Typically, a maintenance processor (not shown) coupled to memory will detect the errors and initiate the reconfiguration. For example, the maintenance processor may determine that, for a certain number of words retrieved from a particular memory bank, a certain bit location has consistently produced only one logic level. Given the probability that all bit locations in a memory bank will produce different logic levels over time, this "solid" bit could indicate that a bit location in a memory bank is defective and thus produces only one logic level regardless of what data was intended to be stored in that location.

The maintenance processor typically uses a hardware error or fault detection. The hardware error or fault detection is similar to "single error correction double error detection" (SECDED), except that the hardware performs "single; byte correction double byte detection" (SBCDBD). Each byte in the implementation shown comprises four bits with each four bit segment preferably stored on a separate memory chip. Upon detecting an error or fault, the hardware SBCDBD sends an error code to a status register, which indicates the byte in error, and also sets a memory interrupt. Software executed by the system then responds to the interrupt and reads the status register. By knowing which byte is in error or has a fault condition, the software formulates a corresponding configuration code for "sparing out" the memory chip which contains the defective byte by using the memory reconfiguration circuitry. The software then transmits the configuration code to configuration registers (for example, see element 131 in FIG. 6) so that reconfiguration circuitry can shift write data around the defective memory chip.

The system typically transmits configuration codes and data over the same paths. The following is an example of how a configuration code (CC) can be incorporated within a configuration word format.

$$2^{63} \quad \ldots \quad 2^{43} \quad 2^{32} \; 2^{31} \quad \ldots \quad 2^{11} \quad 2^0$$
| \_\_\_\_\_\_\_\_\_\_CC CC CC\_\_\_\_\_\_\_\_\_\_\_\_\_\_\_CC CC CC |
  Module N+1                   Module N Table 1 shows an example of four bit configuration codes. The configuration codes effectively identify a defective chip within a memory array. For example, configuration code 0011 (binary "3") may indicate that memory chip 3 is defective ( see FIG. 4 ).

TABLE 1

| CODE | | |
|---|---|---|
| Decimal | Binary | MEANING |
| 00–09 | 0000–1001 | Deselect chip in row |
| 10–13 | 1010–1101 | Unused - same as default |
| 14 | 1110 | Disable configuration |
| 15 | 1111 | Default configuration |

As shown in FIG. 5, bit shift control units store the configuration codes for use in reconfiguring memory. Bit shift control units 120 and 121 store configuration codes for bank 0. Bit shift control unit 120 transmits a configuration code to bit shift control unit 121 if serial channel 126 is enabled. Bit shift control units 123 and 124 store configuration codes for bank 1. Bit shift control unit 123 transmits a configuration code to bit shift control unit 124 if serial channel 119 is enabled.

The bit shift control units transmit a control signal to a bit shifter, which shifts a portion of the data word before transmitting the data word to an output buffer in the memory driver. Memory driver 103 decodes a reference and stores the defective bit code in bank 0 bit shift control 120. Bank 0 bit shift control 120 may, if enabled, transmit the defective bit code to bank 0 bit shift control 121 in the memory receiver through a serial channel controller 126. Therefore, the bit shift control units for bank 0 in both the memory driver 103 and memory receiver 105 may contain the same defective bit code. Bit shift control 120 transmits a control signal to bank 0 bit shifter 125 so that any subsequent data word transmitted to bank 0 is shifted four positions or by an appropriate amount. When this shifted configuration of the data word is transmitted to bank 0 through the output buffer 111, the data word is shifted around a defective chip, and the spare IC chip is effectively configured into the bank for providing sufficient storage capacity without having to use the defective chip.

When the data word is read from bank 0, bit shifter 113 may shift the data word. Bit shifter 113 is controlled by bank 0 bit shift control 121. Bit shifter 113 shifts the data word from bank 0 to a configuration determined by a shift code stored within bit shift control 121. This configuration of the data word is then transmitted to one of the plurality of output holding registers 114 and eventually through the crossbar network to its intended destination.

The system performs reconfiguration of bank 1 in a similar manner.

Figure 6:
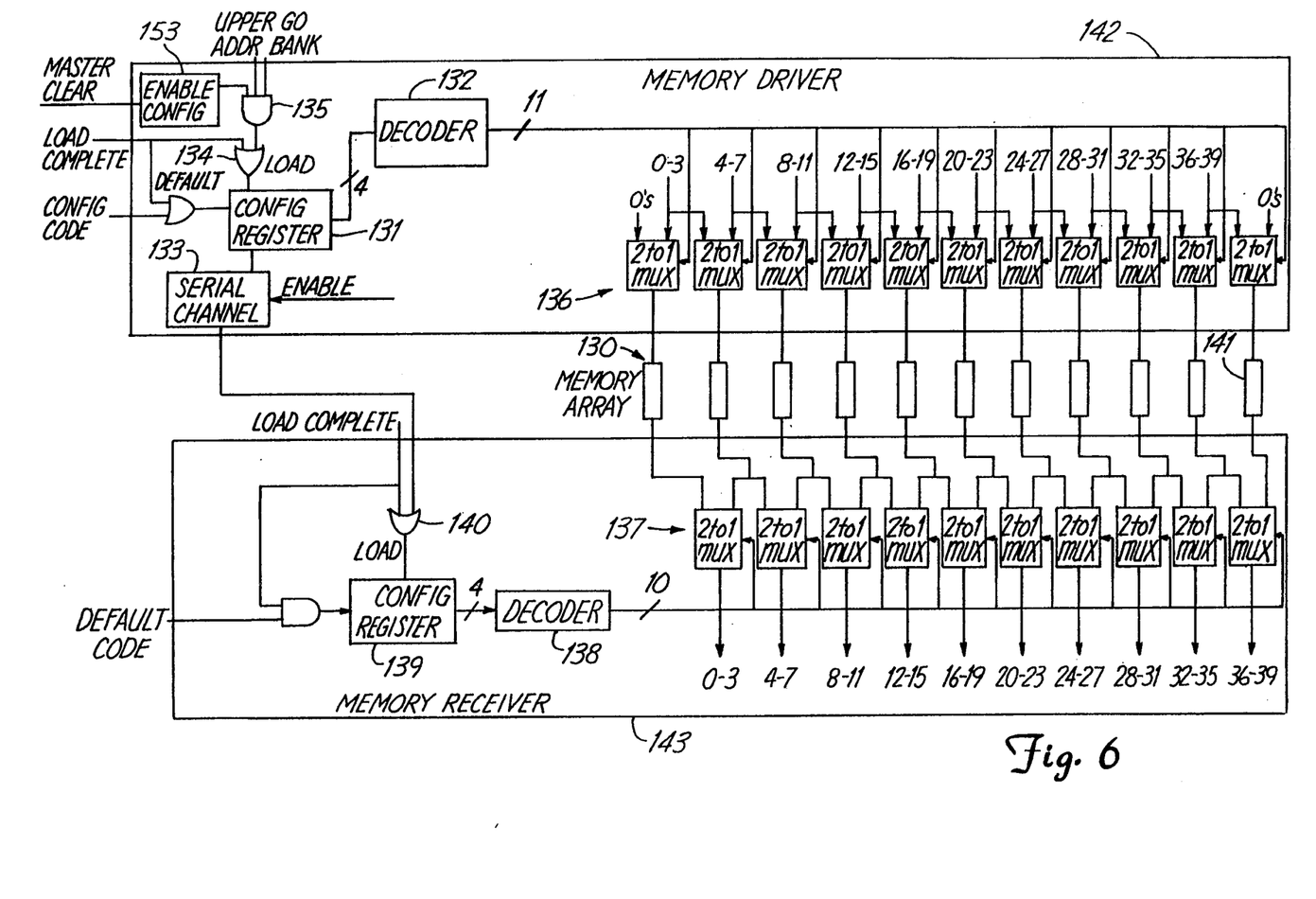
FIG. 6 is a block diagram of the reconfiguration circuitry for a single memory array.

FIG. 6 is a block diagram showing in more detail shifting circuitry which performs the memory reconfiguration. The circuitry includes a memory driver 142 which performs the shifting of data on the input side of a memory array 130. Memory driver 142 includes configuration registers 131 which receive a configuration code, stored within a configuration word, for use in determining how to shift the write data. Configuration registers 131 are controlled by a load signal received from OR gate 134. An Upper Address signal and Go Bank signal are ANDed together by gate 135 and serve as one input to OR gate 134. The other input to OR gate 134 is a Master Clear signal.

Configurations registers 131 transmit a four bit configuration code to a decoder 132. A series of two-to-one multiplexers 136 receive an output of decoder 132 and perform the shifting of write data on the input side of memory array 130. Therefore, the use of two-to-one multiplexers 136 allows incoming write data to be transmitted to one of two four bit elements in memory array 130. Memory array 130 also includes a spare memory chip 141. Decoder 132 thus receives a four bit configuration code which identifies a defective chip within memory array 130. In response, decoder 132 outputs an eleven bit signal which controls the state of two-to-one multiplexers 136 such that input write data is effectively shifted around the defective chip.

A memory receiver 143 controls the shifting of data on the output side of memory array 130. Memory receiver 143 includes configuration registers 139 for holding configuration codes, which are decoded by a decoder 138. A series of two-to-one multiplexers 137 receive signals from decoder 138 may perform shifting on the output side of memory array 130 in order to reconfigure the data. Configuration registers 139 and decoder 138 operate in a similar manner as that in memory driver 142. Decoder 138 receives a four bit configuration code which identifies how two-to-one multiplexers 137 are to ship the data. In response, decoder 138 outputs a ten bit signal which controls the state of two-to-one multiplexers 137 so that the output write data is reconfigured in a particular manner.

A serial channel controller 133 provides for independent shifting of data on the inputs and outputs to memory array 130. An Enable signal provides the capability to selectively transmit configuration codes from configuration registers 131 to configuration registers 139. This allows the capability to perform shifting of data on the inputs and outputs independent of one another. For example, a computer can read data from memory array 130 in its originally stored state, while at the same time writing new data to memory array 130 in a shifted state by including a configuration code in configuration registers 131 and disabling serial channel 133 so that the configuration codes are not transmitted to memory receiver 143. In addition, the system may perform different amounts of shifting on the inputs and outputs. The system can load a first configuration code if the configuration registers 131 can transmit the first configuration codes to configuration registers 139. Next, the system can disable serial channel 133 and transmit a second configuration code to configuration registers 131. Therefore, configuration registers 131 on the input side may contain a different configuration code than configuration registers 139 on the output side. The reconfiguration circuitry may also perform certain types of shifting operations on the data contained within memory array 130, regardless whether any chip within memory array 130 is defective.

A Load Complete signal sets configuration registers 131 to default. A Load Complete signal preferably occurs when clock signals are loaded on the system. The system preferably uses a Master Clear signal to arm configuration registers 131. After the system arms configuration registers 131, they preferably remain armed until a configuration sequence is initiated. Once the system writes a configuration code, configuration registers 131 are disarmed and preferably cannot be loaded again until after another Master Clear signal.

Figure 7:
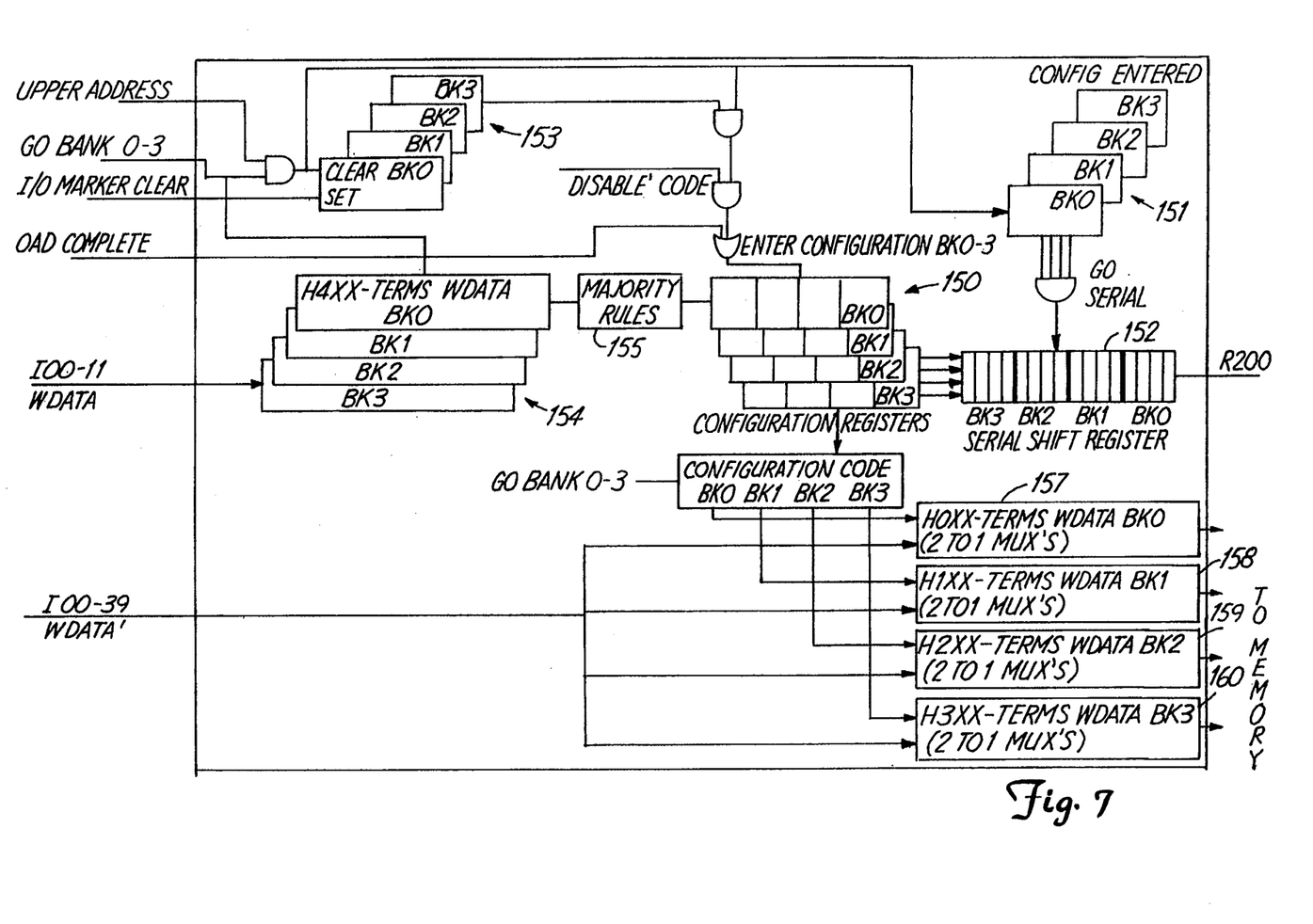
FIG. 7 is a block diagram of input reconfiguration circuitry for four memory banks.

FIG. 7 is block diagram illustrating configuration circuitry for four banks of memory. Registers 153 receive and hold control codes, which are subsequently transmitted to registers 151. Registers 154 receive a portion of the data words which contains configuration codes. The configuration codes are transmitted to configuration registers 150. The configuration codes are then further transmitted to a serial shift register 152. The configuration decode circuitry 156 receives configuration codes from configuration registers 150 and performs a decoding of the configuration codes for controlling two-to-one multiplexers.

Circuits 157–160 each contain a plurality of two-to-one multiplexers for one of the banks of the memory. Therefore, each of the circuits 157–160 receive write data and perform shifting of the write data via the corresponding plurality of two-to-one multiplexers. Circuits 155 perform fault tolerance the configuration codes. Each configuration code, in the example shown, is four bits long. The system transmits from registers 154 twelve bits which comprises three copies of a configuration code. Circuit 155 then compares each of the three configuration codes and checks for a match of at least two of the configuration codes. If at least two of the configuration codes match, then circuit 155 transmits the matching configuration code to configuration registers 150.

Figure 8:
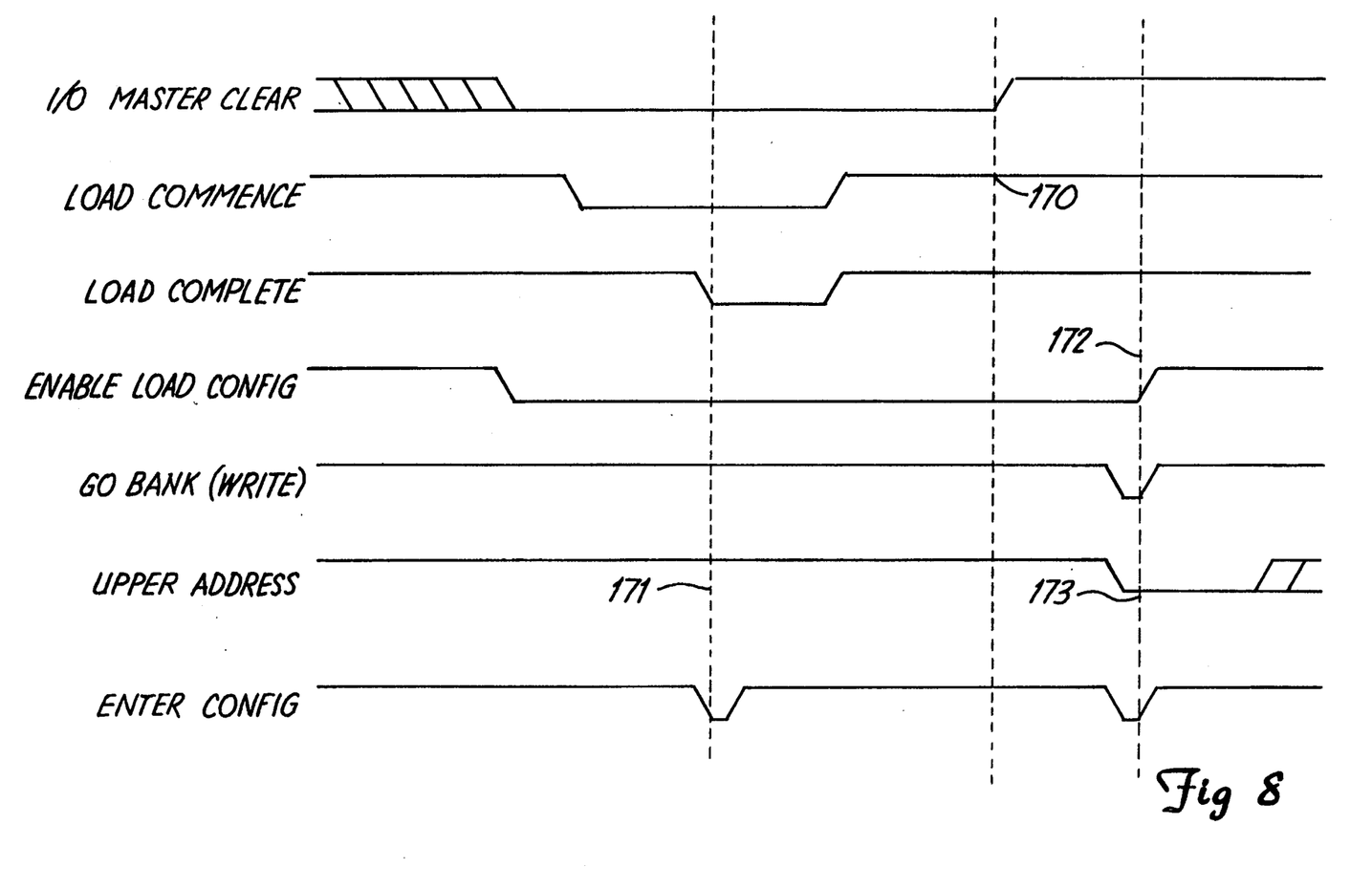
FIG. 8 is a timing diagram for a reconfiguration of memory.

FIG. 8 is a timing diagram for a reconfiguration of memory. At time 170, a trailing edge of an I/O Master Clear signal sets an enable load configuration signal. At time 171, a leading edge of a Load Complete signal broadsides load default values into configuration registers without disabling the registers. At time 172, the Enable Load signal is cleared. At time 173, the Enable Load Go Bank and Upper Address signals loads current write data into the configuration registers.

While the present invention has been described in connection with the preferred embodiment thereof, it will be understood that many modifications will be readily apparent to those skilled in the art, and this application is intended to cover any adaptations or variations thereof. For example, data words of different lengths may be used without departing from the scope of the invention. Likewise, the preferred embodiment of the present invention is shown wherein a plurality of memory IC chips are used, each IC chip storing four bits or information. One skilled in the art will recognize that IC chips with a different storage capacity may be used, and a different number of spare bits may be used, without departing from the scope of the invention. It is manifestly intended that this invention be limited only by the claims and equivalents thereof.

What is claimed is:

1. A system for reconfiguring a computer memory which includes a memory array comprising a plurality of memory storage elements which include at least one spare memory storage element, the system comprising:

receive means for receiving a configuration code and a data word;

input shift means, coupled to the input means, for shifting the data word in response to the configuration code;

input means for transmitting the shifted data word to the memory array;

output means for receiving the shifted data word from the memory array;

selection means for receiving an enable signal and for selectively transmitting the configuration code to the output means in response to the enable signal; and output shift means, coupled to the output means, for shifting the shifted data word in response to the configuration code if the selection means transmitted the configuration code to output means in response to the enable signal.

2. The system of claim 1 wherein the input shift means comprises:

a decoder coupled to the receive means; and a plurality of multiplexers, each of the multiplexers having inputs coupled to receive different portions of a data word, a control input coupled to the decoder, and an output coupled to one of the memory storage elements.

3. The system of claim 1 wherein the output shift means comprises:

a decoder coupled to receive the configuration code; and a plurality of multiplexers, each of the multiplexers having inputs coupled to receive data from different memory storage elements, a control input coupled to the decoder, and an output coupled to an output data bus.

4. The system of claim 1 wherein the selection means comprises a serial channel controller having an input for receiving the configuration code from the receive means, a control terminal for receiving the enable signal, and an output for transmitting the configuration code to the output means if the selection means received the enable signal.

5. The system of claim 1, further comprising verification means, coupled to the receive means, for receiving a plurality of configuration codes, for determining if at least two of the configuration codes match, and for transmitting to the receive means the matching configuration code.

* * * * *